United States Patent [19]

Betts et al.

[11] Patent Number: 5,155,438
[45] Date of Patent: Oct. 13, 1992

[54] SPARK MAP FOR A RESISTIVE MATERIAL USING MAGNETIC FIELD DETECTION

[75] Inventors: Robert E. Betts; David R. Dreitzler, both of Huntsville, Ala.

[73] Assignee: The United States of America as represented by the Secretary of the Army, Washington, D.C.

[21] Appl. No.: 673,915

[22] Filed: Mar. 25, 1991

[51] Int. Cl.⁵ ..................... G01R 31/00; G01N 27/82
[52] U.S. Cl. .................................. 324/502; 324/529; 324/213; 324/263
[58] Field of Search ............... 324/501, 529, 536, 551, 324/557, 213, 216, 228, 263, 502

[56] References Cited

U.S. PATENT DOCUMENTS

| | | | |
|---|---|---|---|
| 2,994,032 | 7/1961 | Hansen | 324/213 |
| 3,262,053 | 7/1966 | Nasir et al. | 324/213 |
| 3,845,382 | 10/1974 | Förster | 324/213 |
| 4,446,420 | 5/1984 | Drouet | 324/529 X |

Primary Examiner—Jack B. Harvey
Attorney, Agent, or Firm—Freddie M. Bush; Hugh P. Nicholson

[57] ABSTRACT

A process for mapping the path of an electric arc through a sample of resistive material whereby the magnetic field propagated by the arc is recorded on a sleeve of magnetic sensitive material which surrounds the sample, with the intensity of the recorded field at different points on the sleeve indicating the path of the arc.

3 Claims, 2 Drawing Sheets

SPARK MAP FOR A RESISTIVE MATERIAL USING MAGNETIC FIELD DETECTION

The invention described herein may be manufactured, used, and licensed by or for the Government for governmental purposes without the payment to us of any royalties thereon.

BACKGROUND OF THE INVENTION

It has long been known that explosives and propellants are susceptible to unwanted ignition from electrostatic discharges (ESD), i.e. ESD arcs. Investigation of this phenomena has been active for a long time, but knowledge of the flow, interaction, field, and arc path are virtually nonexistent.

Previously, the only way to determine the path of an arc through a resistive material such as a solid propellant was by observing damage done by the arc. If the damage was large enough, X-raying could partially reveal the path. Dissection of the resistive material might also reveal the path, but this would destroy the sample. Because of these limitations, a need existed for a process for making a map of an arc through a sample of resistive material without any degradation of the sample and without being dependent on the sample being degraded by the arc. Such a process will aid in a better understanding of the ESD phenomena.

SUMMARY OF THE INVENTION

In accordance with this invention, a process is provided that maps the path of an electric arc through a sample of resistive material. The map is created by wrapping an unexposed magnetic tape around the periphery of the sample. When an arc is transmitted through the sample, it creates a magnetic field which causes an exposure reaction on the magnetic tape, thus mapping the path of the arc. The main exposure reaction is from the magnetic field as is generally emitted in a plane perpendicularly from the longitudinal axis of the sample to the surface of the sample with the intensity of the recorded magnetic field at any one point being inversely proportional to the distance from the arc.

DESCRIPTION OF THE PREFERRED EMBODIMENT

Figure 1:
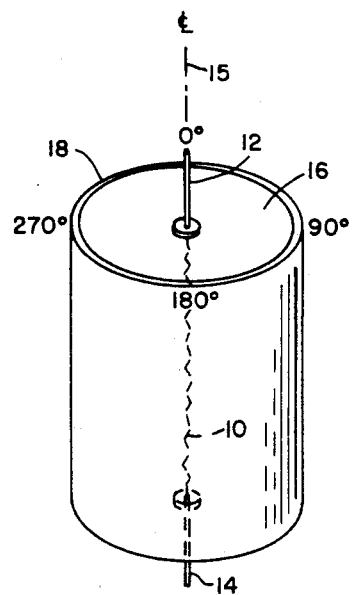
FIG. 1 is a schematic view of the invention, with an arc traveling along the axis of a cylindrical sample.
Figure 2:
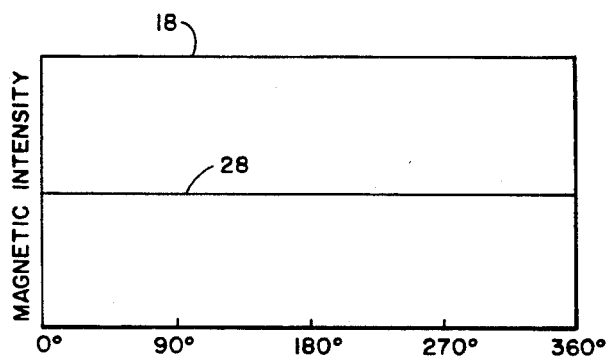
FIG. 2 is a front view of the exposed magnetic tape from the arced sample shown in FIG. 1, with an exposure intensity line representing a uniform magnetic field across the tape.
Figure 3:
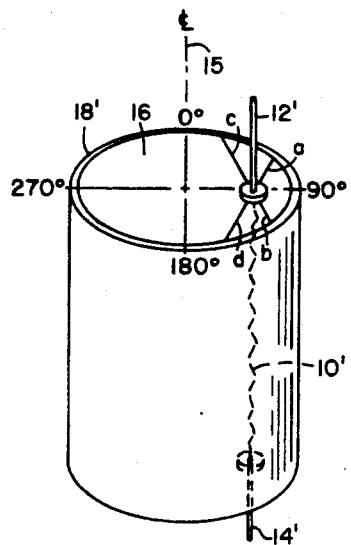
FIG. 3 is a schematic view of the invention, with an arc traveling parallel to the longitudinal axis of the cylindrical section on a line located between the axis and periphery of the sample.
Figure 4:
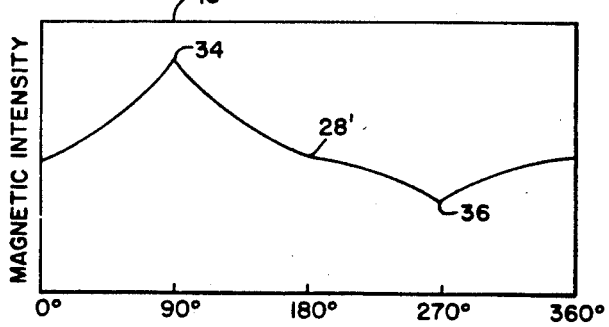
FIG. 4 is a front view of the exposed magnetic tape from the arced sample shown in FIG. 3, with an exposure intensity line having a spike and valley respectively representing an intensified magnetic field on the portion of the tape nearest arc path, and reduced magnetic field on the portion of the tape furtherest arc path.
Figure 5:
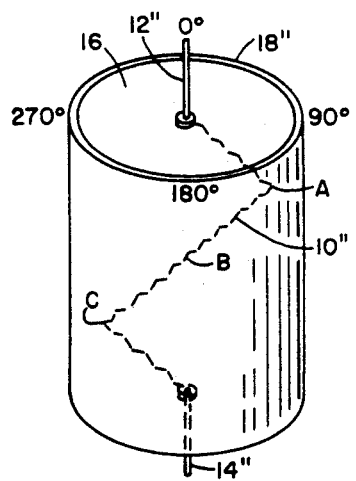
FIG. 5 is a schematic view of the invention, with an arc traveling a zig zaged path a cylindrical sample.
Figure 6:
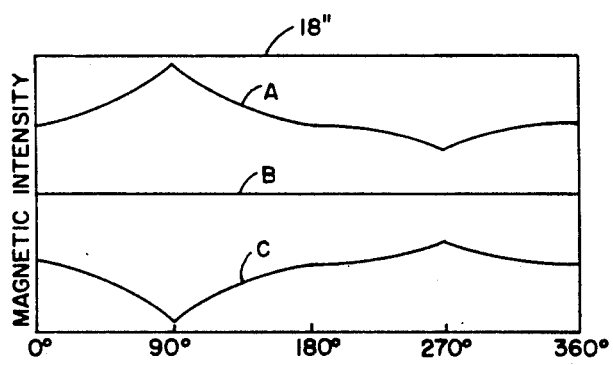
FIG. 6 is a front view of the exposed magnetic tape from the arced sample shown in FIG. 5, with exposure intensity lines having spikes and valleys respectively representing an intensified magnetic field on portions of the tape nearest the arc path, and reduced magnetic field on portions of the tape furtherest from the arc path.

Referring now to the drawings, wherein like numbers refer to like parts, FIG. 1 shows momentary electric arc 10 from electrode 12 to electrode 14, with the arc passing through the center line or longitudinal axis 15 of a right cylindrical test sample 16 of resistive material. The arc creates a magnetic field which causes exposure on a sleeve 18 of previously unexposed magnetic tape which is positioned 360° around the test sample 16. FIGS. 3 and 5 show essentially the same configuration as that shown in FIG. 1 except that arcs 10' and 10" follow different paths than does arc 10 of FIG. 1. FIGS. 2, 4, and 6 show sleeves 18, 18', and 18" respectively after exposure to an arc and laid flat. The flattened sleeve 18 of FIG. 2 shows a magnetic scan line 28 which represents one plane normal to the longitudinal axis of the sample 16 and one point on the arc path 10. Flattened sleeve 18' of FIG. 4 shows a magnetic scan line 28' with the spike 34 on the line representing high intensity exposure on the sleeve due to nearness to arc path 10' and the valley 36 representing low intensity exposure due to remoteness from arc path 10'. It is noted, however, that the actual scan line will be straight across sleeve 18' and that the spike and valley are added for illustration purposes only. Flattened sleeve 18" of FIG. 6 shows multiple scan lines, with nearness and remoteness to arc 10" represented by the spikes and valleys of the scan lines. The top scan line shown on FIG. 6 represents the magnetic intensity created on the recording sleeve when the arc 10" is at point 6 A of sample 16 shown in FIG. 5; the middle scan line represents the magnetic intensity created at point B of the arc, and the bottom scan line represents point C. The path of the arc can be reconstructed by a correlation of high intensity parallel planar areas of exposure on the tape with the areas of less intense exposure.

The magnetic tape sleeve used in this invention is preferably similar in construction to the tapes used in the sound and video industry, but is not limited to such construction. Any device that can measure the intensity of a magnetic field that is propagated to the surface of the sample will do.

The test sample is preferably a right cylinder in shape, but it is not limited to such a shape. With computerized analysis of magnetic field intensity at the surface of a sample, it is possible to map the path of an arc through a sample of almost any shape.

The magnetic intensity of the arc flows out radially and approximately perpendicular to the longitudinal axis of the sample. The intensity is approximately equal for a given distance from the arc path, but it diminishes with distance away from the arc path. The surface of the tape is magnetized with an intensity that is proportional to the magnetic flux level created by the arc. For a circle that is formed by a plane taken through the right cylinder sample, said plane being perpendicular to the longitudinal axis of the sample, a line on the magnetic tape that corresponds to the circular line of the sample will be magnetized proportionally to the closeness of the source arc. At each planer level this is true. Thus, using FIG. 3 for example, with the electrodes mounted parallel to axis 15 in a plane passing through the 90" and 270' reference positions on the sample 16 and the sleeve 18" points a and b lie in a plane normal to the axis 15 and the same distance away from the electrodes current path, arc 10′. Since these distances are equal the intensity is approximately equal at points a and b. Similarly the intensity at points c and d would also be equal since these two points are also equal distance from the arc path. However, the intensity recorded at points a and b is greater than that at points c and d. After exposure, the tape is laid flat and a line on it magnetically scanned to determine the magnetic flux created by the arc at one point on its path. Such a scan represents one point on the arc. Successive and adjacent scans across the tape represents successive planes normal to axis 15 passing through the sample with the corresponding points on the arc. Reconstruction of these planes and points in a drawing will then identify the path of the arc. This is true for a single arc path or for an arc path whose current dominates in a multiple arc discharge.

Multiple arc discharges would give a zonal type map rather than a singular line map which represents a single path discharge. In any case, this spark map method will allow detailed information and greater understanding to be gathered on the ESD phenomena in solid rocket propellants and other resistive materials without degradation to the propellants or materials.

I claim:

1. A process for mapping the path of an electric arc through a sample of resistive material, comprising
    a. providing a sleeve of a means for recording the intensity of a magnetic field,
    b. positioning a sample of resistive material within the sleeve, and
    c. driving a momentary arc of electrical current through the sample, and
    d. recording the magnetic field generated by said current on said sleeve.

2. A process as set forth in claim 1 wherein the step on providing a sleeve of a means is a step of providing a magnetic tape sleeve.

3. A process as set forth in claim 1, with said sample being generally right cylindrical in shape and positioned so that the peripheral surface is adjacent to said sleeve.

* * * * *